(12) United States Patent
Noguchi et al.

(10) Patent No.: US 7,738,244 B2
(45) Date of Patent: Jun. 15, 2010

(54) DISPLAY DEVICE

(75) Inventors: Satoshi Noguchi, Itami (JP); Hiroyasu Maeta, Matsumoto (JP); Tomokatsu Kinugawa, Matsumoto (JP)

(73) Assignee: Epson Imaging Devices Corporation, Azumino-shi, Nagano (JP)

( * ) Notice: Subject to any disclaimer, the term of this patent is extended or adjusted under 35 U.S.C. 154(b) by 188 days.

(21) Appl. No.: 11/898,547

(22) Filed: Sep. 13, 2007

(65) Prior Publication Data

US 2008/0068785 A1 Mar. 20, 2008

(30) Foreign Application Priority Data

Sep. 15, 2006 (JP) ............... 2006-250393

(51) Int. Cl.
*H05K 5/00* (2006.01)
*H05K 7/00* (2006.01)
(52) U.S. Cl. ................................ 361/679.21
(58) Field of Classification Search ............ 361/679.21
See application file for complete search history.

(56) References Cited

U.S. PATENT DOCUMENTS

| 5,739,880 | A | * | 4/1998 | Suzuki et al. ............... 349/110 |
| 6,160,349 | A | * | 12/2000 | Nagai .......................... 315/85 |
| 2003/0011735 | A1 | | 1/2003 | Kato |
| 2006/0193117 | A1 | | 8/2006 | Miyata |
| 2007/0019378 | A1 | * | 1/2007 | Kwon .......................... 361/685 |

FOREIGN PATENT DOCUMENTS

| JP | 1-237523 A | 9/1989 |
| JP | 8-36189 A | 2/1996 |
| JP | 9-258203 A | 10/1997 |
| JP | 2001-100233 A | 4/2001 |
| JP | 2003-29288 A | 1/2003 |
| JP | 2004-325967 A | 11/2004 |
| JP | 2006-163100 A | 6/2006 |
| JP | 2006-163101 A | 6/2006 |

* cited by examiner

*Primary Examiner*—Jayprakash N Gandhi
*Assistant Examiner*—Anthony M Haughton
(74) *Attorney, Agent, or Firm*—Westerman, Hattori, Daniels & Adrian, LLP

(57) ABSTRACT

A display device of the invention includes a liquid crystal display panel 1, an FPC 5, a box-formed storing case 4, and an FPC 7. The liquid crystal display panel 1 is provided with an ITO film 18 on its front side. The FPC 5 is attached to the liquid crystal display panel 1, has at least a ground line 5a, and is connected to an external device 40. The storing case 4 includes at least a rear side case (metal case) 3 electrically connected to the ITO film 18, as well as stores the liquid crystal display panel 1. The FPC 7 electrically connects the ground lines 5a of the FPC 5 and the rear side case 3. With the above-mentioned configuration, a display device can be provided wherein static protection on the front side of the display panel is easily provided.

2 Claims, 10 Drawing Sheets

DISPLAY DEVICE

BACKGROUND

1. Technical Field

The present invention relates to a display device, and more particularly to a display device such as a liquid crystal display.

2. Related Art

As a related-art display device, a liquid crystal display which uses changes of the optical property of liquid crystal for displaying characters and/or images is known. Related-art liquid crystal displays include a vertical-electric-field-mode or lateral-electric-field-mode liquid crystal display.

Generally, related-art liquid crystal displays include a liquid crystal display panel having a structure in which a TFT and a CF substrates are placed facing each other and sandwiching a liquid crystal layer therebetween. The TFT substrate is a substrate onto which a thin-film transistor (TFT) is built on the surface thereof facing the CF substrate. The CF substrate is a substrate on which a color filter (CF) is formed on the surface thereof facing the TFT substrate. In a related-art vertical-electric-field-mode liquid crystal display, an electrode is formed each on the surface, facing the CF substrate, of the TFT substrate and on the surface, facing the TFT substrate, of the CF substrate, and the vertical electric field generated by the electrodes controls the alignment of liquid crystal molecules within the liquid crystal layer. In a related-art lateral-electric-field-mode liquid crystal display, an electrode is formed only on the surface, facing the CF substrate, of the TFT substrate, and the lateral electric field generated by the electrode controls the alignment of liquid crystal molecules within the liquid crystal layer. In the ways described above, in the related-art liquid crystal display, various characters and images are displayed by changing the optical transmittance by controlling the alignment of liquid crystal molecules within the liquid crystal layer.

It should be noted that in the aforementioned related-art lateral-electric-field-mode liquid crystal display, there is a disadvantage that an unintended electric field is applied to the liquid crystal layer because of the generation of static electricity on one of the surfaces of the liquid crystal display panel (more specifically, on the side of the CF substrate on which an electrode is not formed). Thus, in the related-art lateral-electric-field-mode liquid crystal display, static protection is adapted to be provided on one of the surfaces of the liquid crystal display panel (more specifically, on the side of the CF substrate on which an electrode is not formed). (See, for example, JP-A-9-258203.)

JP-A-9-258203 discloses a lateral-electric-field-mode liquid crystal display wherein a transparent conductive film is disposed on the surface, opposite from the TFT substrate, of the CF substrate and the transparent conductive film is electrically connected to a metal case for storing a liquid crystal display panel. In JP-A-9-258203, static protection on one of the surfaces of the liquid crystal display panel (more specifically, on the side of the CF substrate on which an electrode is not formed) is provided by connecting a metal case to the ground potential. However, no specific method of how the metal case should be connected to the ground potential is described.

The aforementioned related-art lateral-electric-field-mode liquid crystal display is sometimes used for a head-up display mounted on a vehicle and the like. Generally in those cases, there is not an enough space available for static protection because the lateral-electric-field-mode liquid crystal display used in those cases is small, with the result that there is a disadvantage that it is difficult to provide static protection on one of the surfaces of the liquid crystal display (more specifically, on the side of the CF substrate on which an electrode is not formed) when a liquid crystal display panel used as a car mounted head-up display is small.

SUMMARY

An advantage of some aspects of the invention is to provide a display device wherein static protection on one of the surfaces of its display panel is easily provided.

A display device according to an aspect of the invention includes a display panel having a surface on which a transparent conductive film is disposed, a first flexible printed circuit board having at least a ground line and provided to the display panel and coupled to an external device, a box-formed storing case storing the display panel and having at least a metal case electrically coupled to the transparent conductive film, and a second flexible printed circuit board electrically coupling the ground line of the first flexible printed circuit board to the metal case.

In the display device according to the present aspect of the invention, static build-up is suppressed as described above by disposing a transparent conductive film on one of the surfaces of the display panel and by electrically connecting a metal case to the transparent conductive film and the ground line of the first flexible printed circuit board to the metal case, with the result that a disadvantage caused by static electricity is suppressed. In this case, by electrically connecting the ground line of the first printed circuit board to the metal case by using the second flexible printed circuit board, it is not necessary to allow a large space for electrically connecting the second flexible printed circuit board to the metal case because the second flexible printed circuit board is flat. Thus in a small display device, electric connection of the second flexible printed circuit board and the metal case is easily provided even if it is difficult to allow a new space within the small display device (in the storing case), with the result that static protection on one of the surfaces of the display panel is easily provided even if the display device is small. In this aspect of the invention, by electrically connecting the ground line of the first flexible printed circuit board to the metal case by using the second flexible printed circuit board, when the first flexible printed circuit board is connected to the external device by having the first flexible printed circuit board being bent, the second flexible printed circuit board may also be bent, similar to the first flexible printed circuit board.

In the display device according to the present aspect of the invention, it is preferable that the second flexible printed circuit board have an internal portion disposed inside of the storing case, and the internal portion of the second flexible printed circuit board be provided with a terminal area on the side of the metal case, the terminal area electrically coupled to the metal case. In the aforementioned configuration, electric connection of the second flexible printed circuit board and the metal case is possible without much changing the appearance of the display device because the electric connection of the second flexible printed circuit board and the metal case is not exposed. In this case, because the second flexible printed circuit board is flat, it is not necessary to allow a large space for disposing the internal portion (the terminal area on the side of the metal case) of the second flexible printed circuit board in the storing case.

In this case, it is preferable that the storing case also include a resin case, the metal and resin cases be engaged with each other so as to be held in a box form, and the terminal area on the side of the metal case of the second flexible printed circuit board be sandwiched between the metal and resin cases with the storing case held in a box form. In the aforementioned configuration, because the falling off of the second flexible printed circuit board's terminal area on the side of the metal case from the metal case can be prevented, the firm connection of the second flexible printed circuit board and the metal case is provided.

In the configuration including the resin case, it is preferable that the internal portion of the second flexible printed circuit board be provided with an engaging aperture, one of the metal and resin cases be provided with a protrusion to be engaged with the engaging aperture of the second flexible printed circuit board, and the terminal area on the side of the metal case of the second flexible printed circuit board be sandwiched between the metal and resin cases with the engaging aperture of the second flexible printed circuit board engaged with the protrusion provided to one of the metal and resin cases. In the aforementioned configuration, the falling off of the internal portion (the terminal area on the side of the metal case) of the second flexible printed circuit board disposed in the storing case from within the storing case can be prevented.

In this case, it is preferable that the protrusion to be engaged with the engaging aperture of the second flexible printed circuit board be provided to the resin case, and the metal case be provided with a hole into which the protrusion provided to the resin case is inserted with the engaging aperture of the second flexible printed circuit board engaged with the protrusion provided to the resin case. In the aforementioned configuration, the falling off of the internal portion (the terminal area on the side of the metal case) of the second flexible printed circuit board from within the storing case is firmly prevented.

As described above, according to the invention, a display device can be provided wherein static protection on one of the surfaces of a display panel is easily provided.

BRIEF DESCRIPTION OF THE DRAWINGS

The invention will be described with reference to the accompanying drawings, wherein like numerals reference like elements.

DESCRIPTION OF EXEMPLARY EMBODIMENTS

Figure 1:
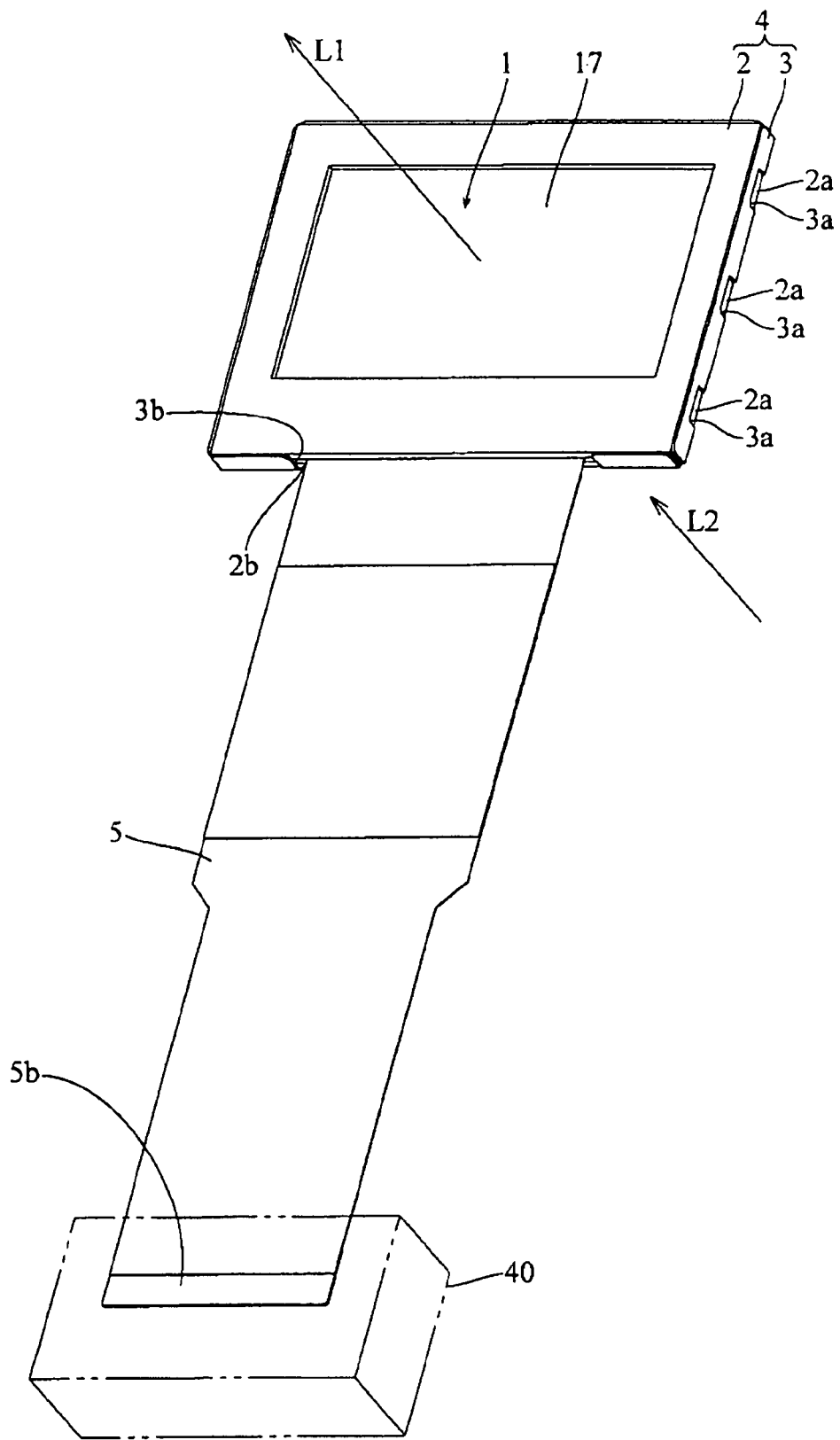
FIG. 1 is a perspective view of a head-up display (display device) according to one embodiment of the present invention, as seen from the front side.
Figure 2:
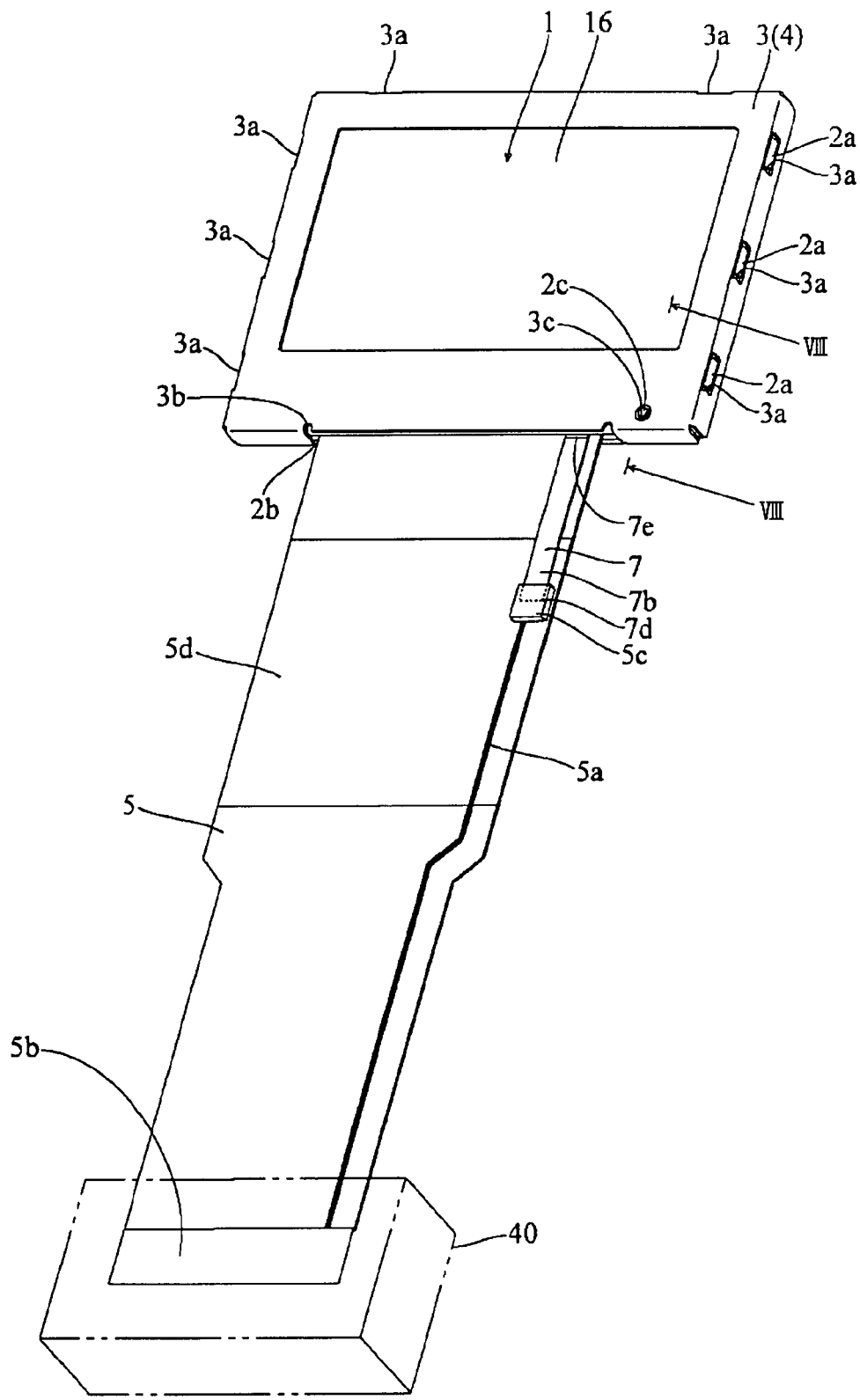
FIG. 2 is a perspective view of the head-up display (display device) according to on the present embodiment of the invention, as seen from the rear side.
Figure 3:
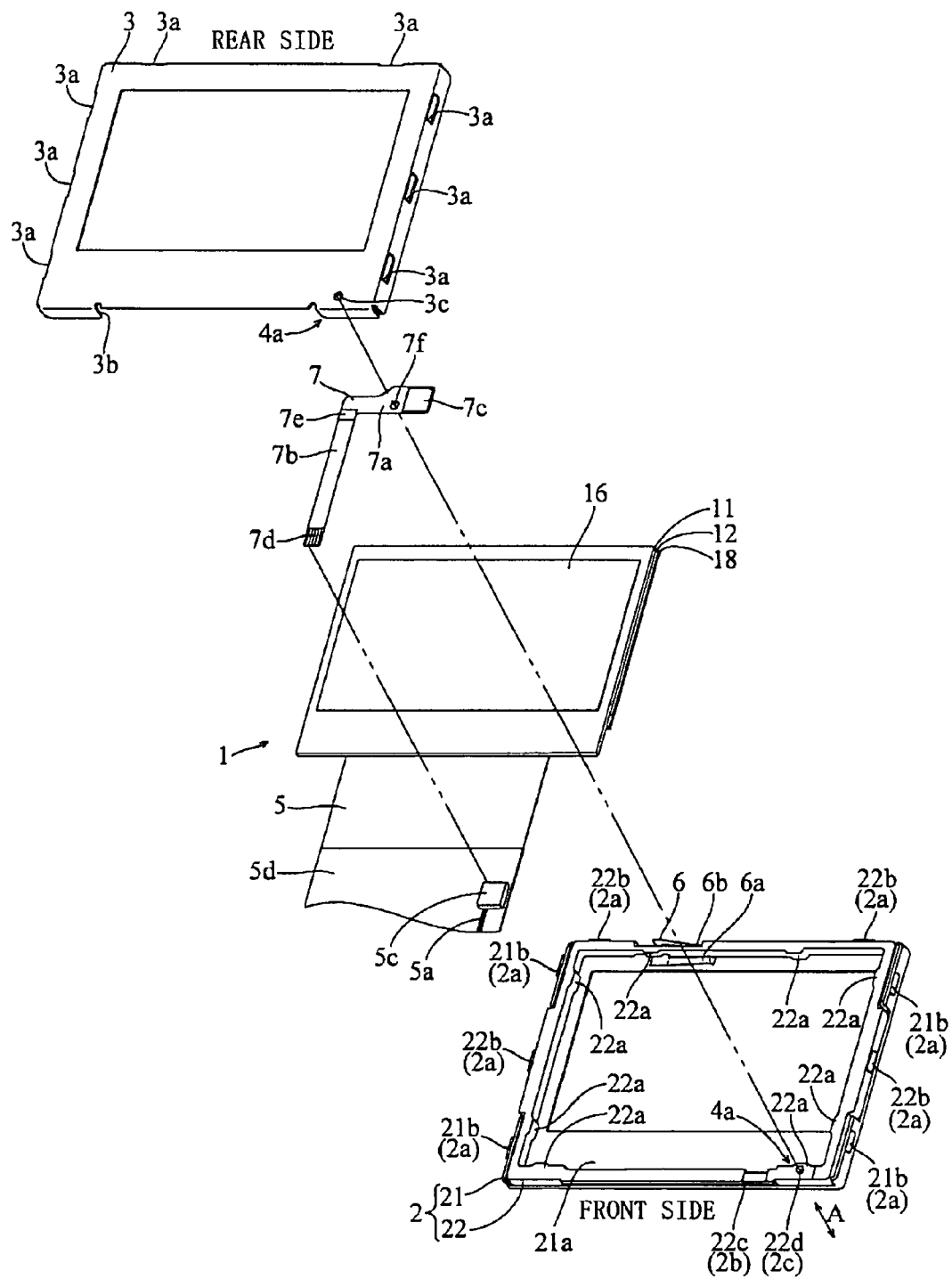
FIG. 3 is an exploded perspective view of the head-up display according to the present embodiment of the invention, as illustrated in FIGS. 1 and 2.
Figure 4:
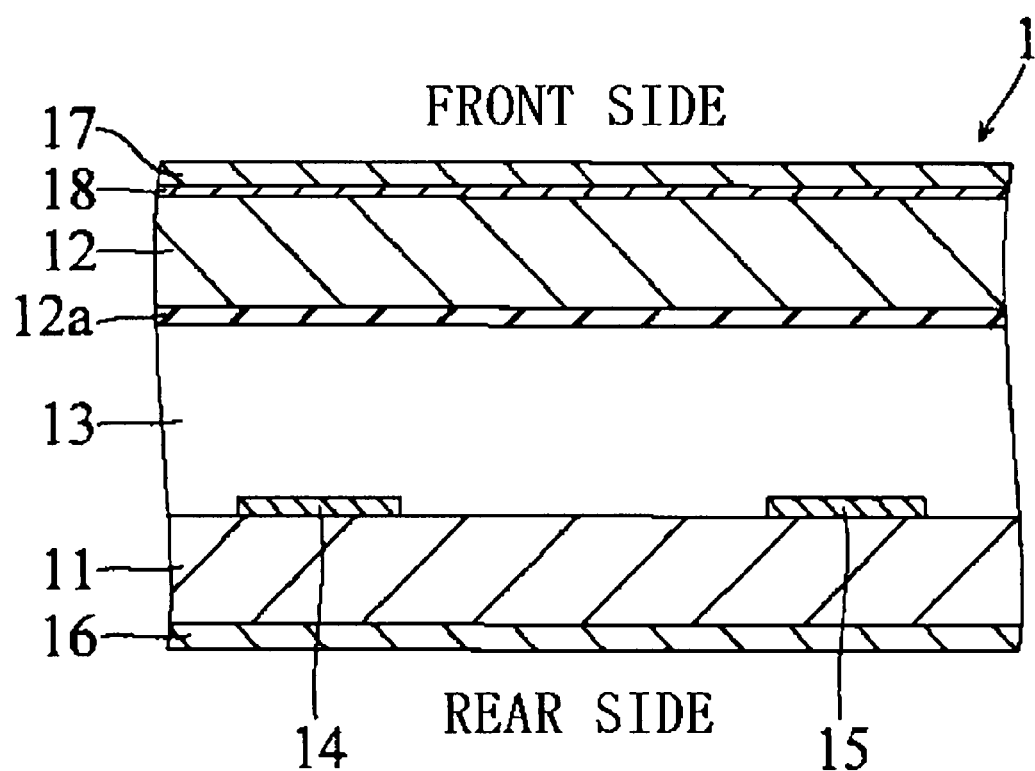
FIG. 4 is a cross-sectional view of a liquid crystal display panel in the head-up display according to the present embodiment of the invention, as illustrated in FIGS. 1 and 2.
Figure 5:
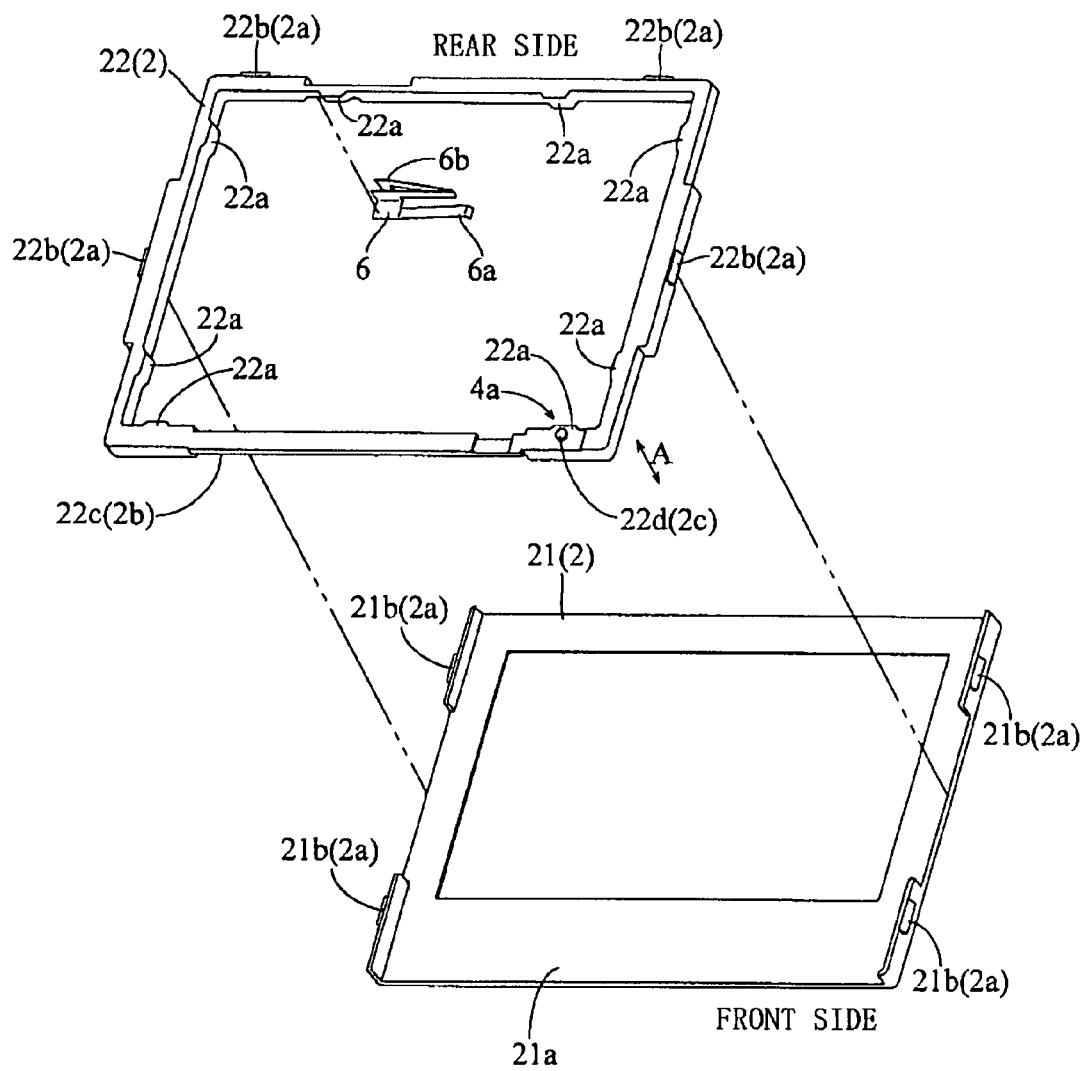
FIG. 5 is an exploded perspective view of a front side case in the head-up display according to the present embodiment of the invention, as illustrated in FIGS. 1 and 2.
Figure 6:
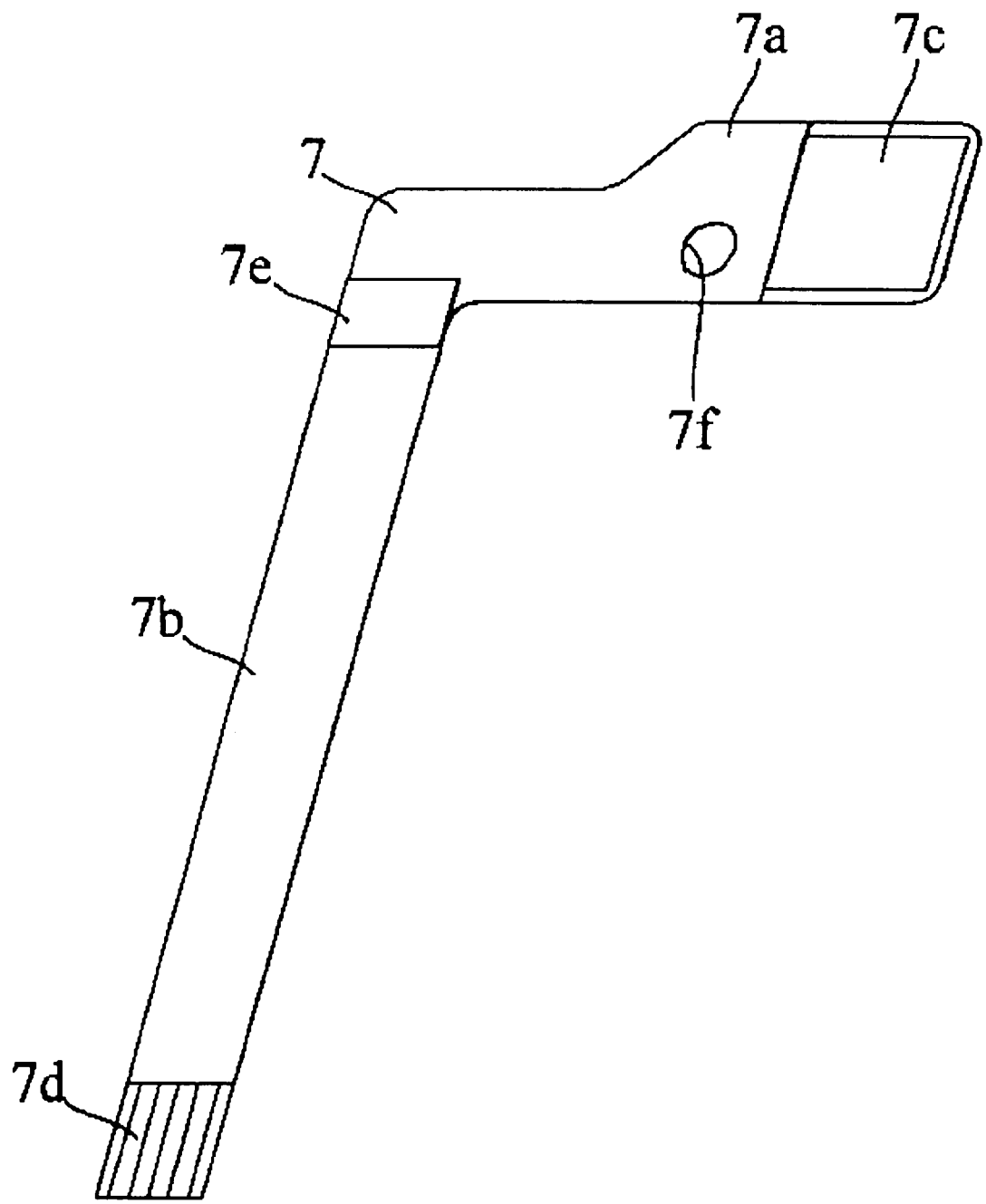
FIG. 6 is a perspective view of a flexible printed circuit board for static protection used in the head-up display according to the present embodiment of the invention, as illustrated in FIGS. 1 and 2.
Figure 7:
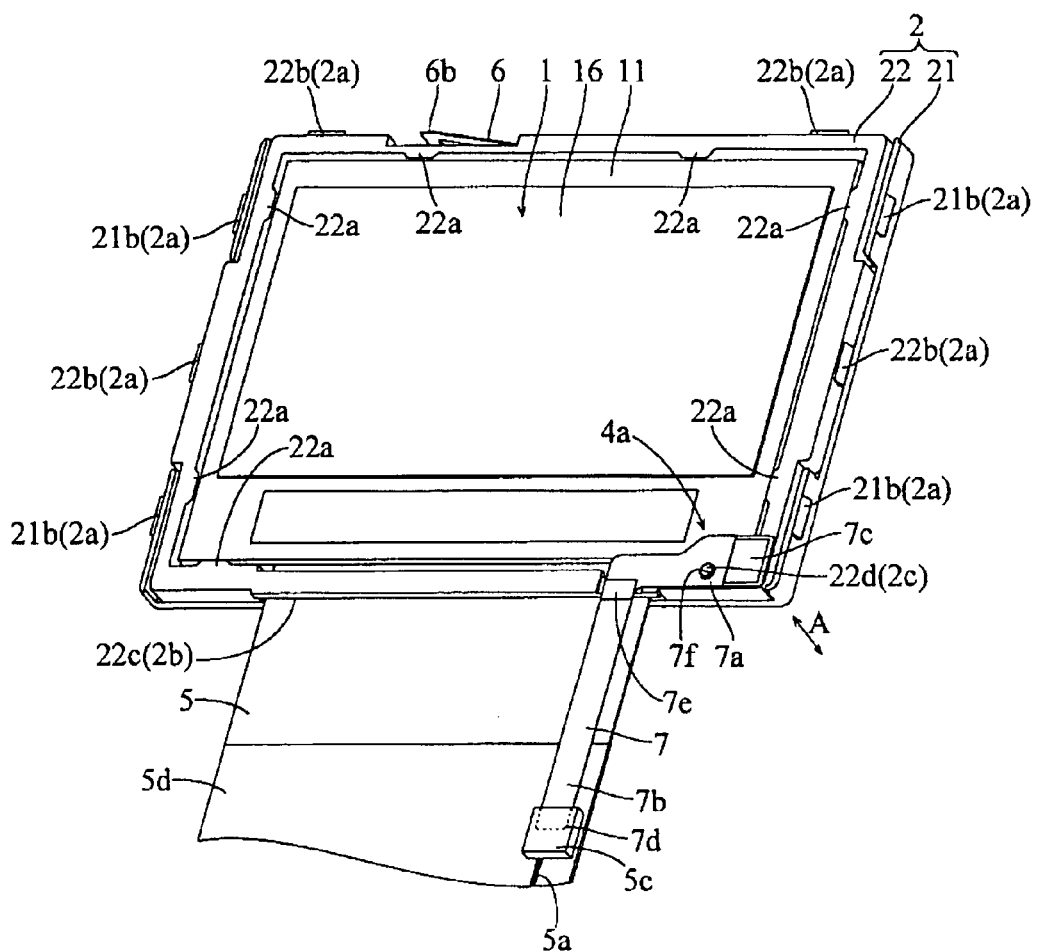
FIG. 7 is a perspective view of the head-up display according to the present embodiment of the invention, as illustrated in FIGS. 1 and 2, with its rear side case removed.
Figure 8:
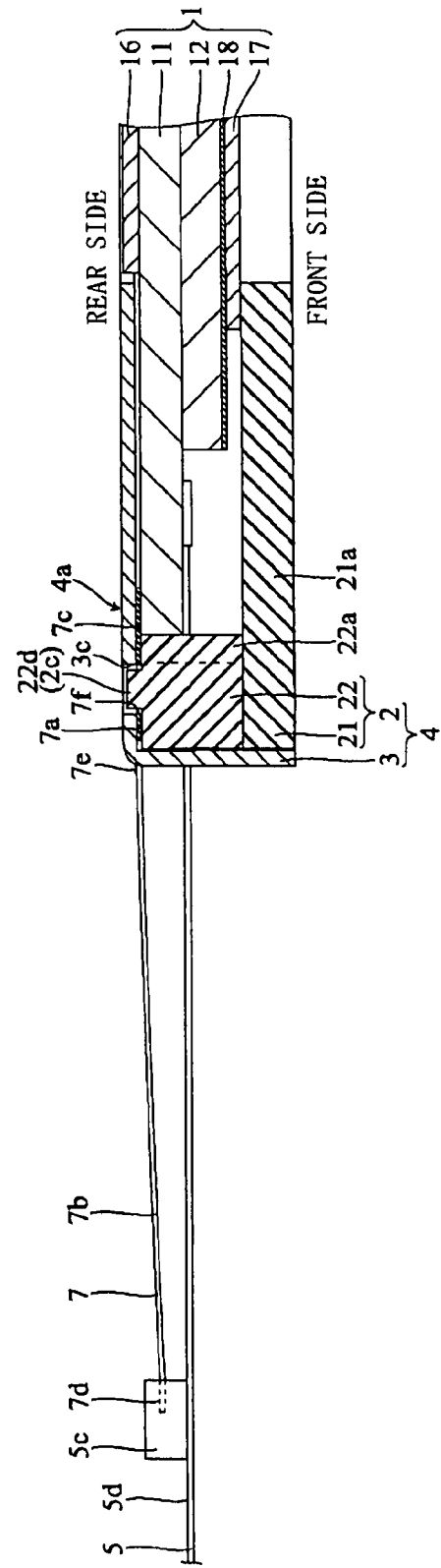
FIG. 8 is a cross-sectional view as taken along the line VIII-VIII of FIG. 2.

FIG. 1 is a perspective view of a head-up display (display device) according one embodiment of the present invention as seen from the front side. FIG. 2 is a perspective view of the head-up display (display device) of the present embodiment of the invention as seen from the rear side. FIG. 3 is an exploded perspective view of the head-up display according to the present embodiment of the invention as illustrated in FIGS. 1 and 2. FIG. 4 is a cross-sectional view of a liquid crystal display panel in the head-up display according to the present embodiment of the invention as illustrated in FIGS. 1 and 2. FIG. 5 is an exploded perspective-view of a front side case in the head-up display according to the present embodiment of the invention as illustrated in FIGS. 1 and 2. FIG. 6 is a perspective view of a flexible printed circuit board for static protection used for the head-up display according to the present embodiment of the invention as illustrated in FIGS. 1 and 2. FIG. 7 is a perspective view of the head-up display according to one embodiment of the invention as illustrated in FIGS. 1 and 2, with its rear side case removed. FIG. 8 is a cross-sectional view as taken along the line VIII-VIII of FIG. 2. First, the structure of the head-up display (display device) according to the present embodiment of the invention will be described referring to FIGS. 1 to 8.

As illustrated in FIG. 1, the head-up display (display device) according to the present embodiment of the invention is configured in such a way that the head-up display is mounted on the dashboard (not shown) and the like of an automobile and can project display light L1 into the windshield (not shown) as a display screen which is disposed on the front side of the head-up display. The display light L1 emitted from the head-up display is generated by having light L2 from a backlight (not shown) provided on the rear side of the head-up display incoming to the head-up display.

The head-up display according to the present embodiment of the invention, as illustrated in FIGS. 1 to 3, is provided with a lateral-electric-field-mode liquid crystal display panel 1, a front side case 2 provided on the front side of the liquid crystal display panel 1, and a rear side case 3 provided on the rear side of the liquid crystal display panel 1. The front side case 2 is made from resin and configured to suppress the reflection of light on the surface thereof. More specifically, by painting the front side case 2 black or by creating slight asperity on the front side case 2, light is diffused. The front side case 2 having the capability to suppress the reflection of light is thus used, in order to prevent a disadvantage that characters and images displayed on the display panel are hardly visible due to the fact that the outside light coming in via the windshield (not shown) as a display screen is reflected by the front side case 2 and the outside light thus glares on the windshield. The rear side case 3 is constituted by having a metal plate being bent. The liquid crystal display panel 1 is stored in a box-formed storing case 4 constituted by having the front side case 2 and rear side case 3 combined together. The liquid crystal display panel 1 is an example of the "display panel" of the invention, the front side case 2 an example of the "resin case" thereof, the rear side case 3 an example of the "metal case" thereof.

The lateral-electric-field-mode liquid crystal display panel 1 is configured as illustrated in FIG. 4 in such a way that a liquid crystal layer 13 is sandwiched between a TFT substrate 11 disposed on the rear side and a CF substrate 12 disposed on the front side. A color filter (CF) 12a is formed on the surface, facing the TFT substrate 11, of the CF substrate 12. A thin-film transistor (TFT) (not shown) is built onto the surface, facing the CF substrate 12, of the TFT substrate 11. A pixel electrode 14 and a common electrode 15, for generating a lateral electric field in the liquid crystal layer 13, are formed on the surface, facing the CF substrate 12, of the TFT substrate 11. The alignment of the liquid crystal molecules within the liquid crystal layer 13 is controlled by the lateral electric field generated between the pixel electrode 14 and common electrode 15.

It should be noted that the liquid crystal display controlled by the lateral electric field is configured in such a way that first and the second electrodes are formed on the liquid crystal layer's side of one of the set of substrates sandwiching the liquid crystal layer, and drives the liquid crystal layer by the electric field generated between the first and the second electrodes. Thus, a so-called fringe field switching mode liquid crystal display panel is also an example of the aforementioned liquid crystal display panel controlled by the lateral electric field, wherein it is configured that the first electrode is formed on the liquid crystal layer's side of one of the pair of substrates sandwiching the liquid crystal layer and that the second electrode is formed on the first electrode with an insulator therebetween, and the liquid crystal layer is driven by the electric field generated between the first and the second electrodes.

A front side polarization plate 17 is provided on the surface, opposite from the TFT substrate 11's side, of the CF substrate 12, while a rear side polarization plate 16, is provided on the surface, opposite from the CF substrate 12's side, of the TFT substrate 11. The rear side and front side polarization plates 16 and 17 are disposed in such a way that each of the transmission axes is angularly offset by about 90 degrees.

The lateral-electric-field-mode liquid crystal display panel 1 further includes an ITO film 18, for static protection, disposed on the front side. More specifically, the liquid crystal display panel 1 is electrically connected to the rear side case 3 with a conductive member 6 therebetween (see FIG. 3), which will be described below, as well as disposed between the CF substrate 12 and front side polarization plate 17. Thus in the present embodiment of the invention, the accumulation of electric charge on the front side of the liquid crystal display panel 1 is suppressed by connecting the rear side case 3 to the ground potential, with the result that a disadvantage caused by static electricity can be suppressed. It should be noted that the ITO film 18 is an example of the "transparent conductive film".

As shown in FIGS. 2 and 3, the liquid crystal display panel 1 (TFT substrate 11) is provided with a flexible printed circuit board (FPC) 5 having a ground line 5a. The ground line 5a of the FPC 5 is connected to the ground potential by having an external connection terminal 5b of the FPC 5 connected to an external device 40 on the side of the automobile. A connector 5c electrically connected to the ground line 5a is mounted on the FPC 5. When the liquid crystal display panel 1 is stored in the storing case 4, a mounting region 5d for mounting an element such as the connector 5c of the FPC 5 is disposed outside the storing case 4. It should be noted that the FPC 5 is an example of the "first flexible printed circuit board" of the invention.

As shown in FIG. 3, engaging holes 3a adapted to be in engagement respectively with a plurality of engaging pieces 2a of the front side case 2 are formed on the side edges of the rear side case 3, as well as a plurality of engaging piece 2a are integrally formed on the side edges of the front side case 2. As shown in FIGS. 1 and 2, the front side case 2 is attached to the rear side case 3 by having the engaging pieces 2a of the front side case 2 engaged with the engaging holes 3a of the rear side case 3. The storing case 4, which is constituted of the front side case 2 and the rear side case 3, is held in a box form by having the front side case 2 attached to the rear side case 3.

As shown in FIG. 5, the front side case 2 of the present embodiment of the invention is divided into a case member 21 having a covering unit 21a covering a non-display region in the liquid crystal display 1 (see FIG. 3) and a case member 22 having a supporting unit 22a supporting the side-edge surfaces of the liquid crystal display panel 1. Juts 21b and 22b, jutting out outwardly, are formed respectively on the case members 21 and 22 which constitute the front side case 2. The aforementioned engaging pieces 2a of the front side case 2 are constituted of the juts 21b and 22b formed respectively on the case members 21 and 22 which constitute the front side case 2.

As shown in FIGS. 1 to 3, terminal drawing units 2b and 3b, for drawing the external connection terminal 5b of the FPC 5 out of the storing case 4, are formed respectively on the predetermined side edges of the front side case 2 and rear side case 3. The terminal drawing unit 2b of the front side case 2 is constituted of a groove portion (aperture area) 22c formed on the case member 22 which is a component member of the front side case 2. The terminal drawing unit 3b of the rear side case 3 is constituted of a cut-out (aperture area) formed on the rear side case 3.

As shown in FIGS. 3 and 5, the conductive member 6 made of a blade spring made from metal (for example, stainless-steel) for static protection is held on the side edge, opposite to the side on which the terminal drawing unit 2b of the front side case 2 is formed. The conductive member 6 has a portion 6a disposed inside the front side case 2 and another portion 6b disposed outside the front side case 2. The portion 6a of the conductive member 6 is configured to be able to bias the front side surface of the ITO film 18 of the liquid crystal display panel and the portion 6b of the conductive member 6 is configured to be able to bias the inside surface of the edge of the rear side case 3. The conductive member 6 is electrically connected to the ITO film 18 by having the portion 6a in contact with the front side surface of the ITO film 18. The conductive member 6 is also electrically connected to the rear side case 3 by having the portion 6b in contact with the inside surface of the edge of the rear side case 3. In other words, in the present embodiment of the invention, the ITO film 18 of the liquid crystal display 1 and the rear side case 3 are electrically connected via the conductive member 6. It should be noted that the aforementioned conductive member 6 is held on the front side case 2's edge by being sandwiched between the case members 21 and 22 which constitute the front side case 2.

Now, in the present embodiment of the invention, as shown in FIGS. 2 and 3, the rear side case 3 and the ground line 5a of the FPC 5 are electrically connected via an FPC 7 in order to connect the rear side case 3 to the ground potential. As shown in FIGS. 6 to 8, this FPC 7 has an internal portion 7a disposed inside the storing case 4 and an external portion 7b disposed outside the storing case 4. Further, the external portion 7b of the FPC 7 is provided with a terminal area 7d which is inserted to the connector 5c mounted on the FPC 5, while the internal portion 7a of the FPC 7 is provided with a terminal area 7c in contact with the inside of the rear side case 3. The FPC 7 is electrically connected to the rear side case 3 by having the terminal area 7c electrically connected to the inside of the rear side case 3. The FPC 7 is also electrically connected to the ground line 5a of the FPC 5 by having the terminal area 7d inserted to the connector 5c of the FPC 5. It should be noted that the FPC 7 is an example of the "second flexible printed circuit board" of the invention and that the terminal area 7c an example of the "metal case side terminal area" of the invention.

As shown in FIGS. 6 and 7, the FPC 7 of the present embodiment of the invention is formed in an L shaped form. More specifically, the FPC 7 is curved by about 90 degrees around a connecting portion 7e connecting the internal portion 7a and external portion 7b. The connecting portion 7e of the FPC 7 is reinforced by making the same portion thicker than any other portion of the FPC 7. An engaging aperture 7f, for engaging with a protrusion 2c of the front side case 2 which will be described below, is formed in a predetermined area of the internal portion 7a of the FPC 7. This engaging aperture 7f of the FPC 7 is formed by drilling a hole in the internal portion 7a of the FPC 7.

In the present embodiment of the invention, in the storing case 4, a region 4a where the internal portion 7a (terminal area 7c) of the FPC 7 is disposed is configured in the way described below. As shown in FIG. 3, the cylindrical protrusion 2c protruding anteroposteriorly (in the direction of A) is integrally formed in an area, corresponding to the region 4a, of the front side case 2. This protrusion 2c of the front side case 2 is constituted of a protrusion 22d formed on the case member 22 which is a component member of the front side case 2. A cylindrical hole 3c into which the protrusion 2c of the front side case 2 is inserted is formed in an area, corresponding to the region 4a, of the rear side case 3.

As shown in FIG. 8, in the present embodiment of the invention, the internal portion 7a (terminal area 7c) of the FPC 7 is sandwiched between the front side case 2 (case member 22) and rear side case 3, with the engaging aperture 7f of the FPC 7 engaged with the protrusion 2c of the front side case 2. Further, when the internal portion 7a (terminal area 7c) of the FPC 7 is sandwiched between the front side case 2 (case member 22) and rear side case 3, the protrusion 2c of the front side case 2 is inserted into the hole 3c of the rear side case 3, with the result that in the present embodiment the internal portion 7a (terminal area 7c) of the FPC 7 can be held in the storing case 4 without fixing the internal portion 7a (terminal area 7c) of the FPC 7 to an element like the storing case 4. As shown in FIGS. 2 and 3, the external portion 7b (terminal area 7d) of the FPC 7 is drawn out of the storing case 4 via the terminal drawing unit 3b for the external connection terminal 5b of the FPC 5 formed on the rear side case 3.

In the present embodiment of the invention, as described above, the accumulation of static electricity on the front side of the liquid crystal display panel 1 can be suppressed by disposing the ITO film 18 on the front side of the liquid crystal display panel 1 and then by electrically connecting the rear side case (metal case) 3 to the ITO film 18 and by electrically connecting the ground line 5a of the FPC 5 and the rear side case 3, with the result that a disadvantage caused by static electricity can be suppressed. In this case, by having the ground line 5a of the FPC 5 and the rear side case 3 electrically connected by using the FPC 7, it is not necessary to allow a large space for electrically connecting the FPC 7 and rear side case 3 because the FPC 7 is flat. Thus, the FPC 7 and rear side case 3 can be easily connected electrically even if it is difficult to allow a new space in the head-up display (in the storing case 4), with the result that static protection on the front side of the liquid crystal display panel 1 is easily provided even if the head-up display is small.

In the present embodiment of the invention, the FPC 7 can also be bent as well as the FPC 5, when the FPC 5 is bent to be connected to the external device 40 such as a controlling device for display, by electrically connecting the ground line 5a of the FPC 5 and the rear side case (metal case) 3 by using the FPC 7 as described above.

In the present embodiment of the invention, by providing the terminal area 7c electrically connected to the rear side case (metal case) 3 on the internal portion 7a of the FPC 7 disposed in the storing case 4 as described above, the electric connection of the FPC 7 and rear side case 3 is not exposed, with the result that the FPC 7 and rear side case 3 can be electrically connected without much changing the appearance of the head-up display. In this case, it is not necessary to allow a large space for disposing the internal portion 7a (terminal area 7c) of the FPC 7 in the storing case 4, because the FPC 7 is flat.

In the present embodiment, falling off of the terminal area 7c of the FPC 7 from the rear side case 3 can be prevented by having the internal portion 7a (terminal area 7c) sandwiched between front side case (resin case) 2 and rear side case (metal case) 3 in the storing case 4 as described above, with the result that the firm electric connection of the FPC 7 and rear side case 3 can be easily provided.

In the present embodiment of the invention, as described above, falling off of the internal portion 7a (terminal area 7c) of the FPC 7, disposed in the storing case 4, from within the storing case 4 can be prevented by having the engaging aperture 7f of the FPC 7 in engagement with the protrusion 2c of the front side case 2, with the protrusion 2c formed on the front side case 2 and with the engaging aperture 7f in engagement with the protrusion 2c of the front side case 2 formed on the internal portion 7a of the FPC 7. In this case, falling off of the internal portion 7a (terminal area 7c) of the FPC 7 from within the storing case 4 can be firmly suppressed by having the protrusion 2c of the front side case 2 inserted to the hole 3c of the rear side case 3, with the hole 3c into which the protrusion 2c of the front side case 2 is inserted formed on the rear side case 3, and with the engaging aperture 7f of the FPC 7 in engagement with the protrusion 2c of the front side case 2.

In the present embodiment of the invention, as described above, damage of the connecting portion 7e of the FPC 7 is prevented even if the connecting portion 7e of the FPC 7 is rubbed against the terminal drawing unit 3b's edge of the rear side case 3 with the FPC 7 bent, by reinforcing the connecting portion 7e connecting the internal portion 7a and external portion 7b in the FPC 7, by making the same portion thicker than any other portions.

Figure 9:
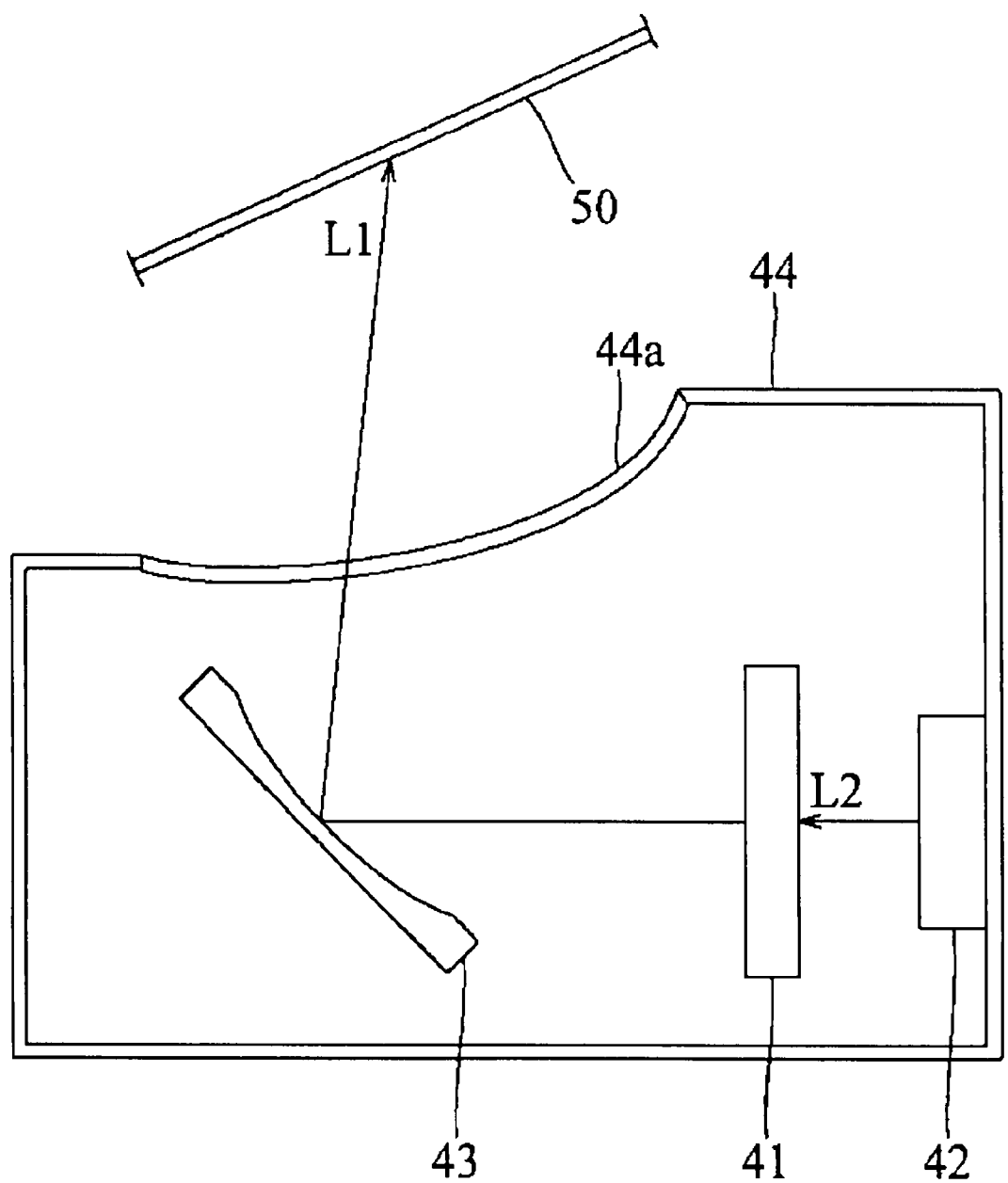
FIG. 9 is a schematic diagram of a device comprising the head-up display according to the present embodiment of the invention.

FIG. 9 is a schematic diagram of a device including the head-up display according to the present embodiment of the invention. Now referring to FIG. 9, a device including the head-up display according to the present embodiment of the invention will be described. It should be noted that the head-up display according to the present embodiment of the invention is referred to as a head-up display 41 in the descriptions below.

As shown in FIG. 9, the head-up display 41 according to the present embodiment of the invention is mounted on a predetermined device so as to be able to project display light L1 to a display screen 50 (for example, the windshield of an automobile). More specifically, the head-up display 41 is disposed between a backlight 42 and a concave mirror 43. The display light L1 emitted from the head-up display 41 is generated by having light L2 from the backlight 42 entering into the head-up display 41. The display light L1 emitted from the head-up display 41 is projected to the display screen 50 by being reflected by the concave mirror 43 toward the display screen 50. The aforementioned head-up display 41, backlight 42, and concave mirror 43 are stored in a case 44 having a window portion 44a which transmits the display light L1.

It should be understood that the embodiments disclosed above are just for illustrating the invention and do not limit the same. The scope of the invention is denoted by the claims, not by the descriptions of the embodiment above. All the modifications within the meanings and the scope equivalent to the claims are also included in the scope of the invention.

For example, in the aforementioned embodiment of the invention, an example is described wherein the invention is applied to a head-up display, however the invention is not limited to the same embodiment, and is applicable to other liquid crystal displays than a head-up display. For example, the invention can be applied to a liquid crystal display used for a projector.

In the aforementioned embodiment of the invention, the front side case is made from resin and the rear side case from metal, however the invention is not limited to the same embodiment, and the front side case may be made from metal and the rear side case from resin.

In the aforementioned embodiment of the invention, an L shaped FPC is used as a static protection FPC, however the invention is not limited to the same embodiment, and an FPC having a shape other than L shape may also be used.

In the aforementioned embodiment of the invention, an ITO film for static protection of a liquid crystal display panel and a metal case are electrically connected via a conductive member constituted of a plate spring, however the invention is not limited to the same embodiment, and an ITO film for static protection of a crystal display panel and a metal case may be electrically connected via a connecting means other than the connecting means described above In the aforementioned embodiment of the invention, an ITO film for static protection is provided separately, however the invention is not limited to the same embodiment, and a front side polarization plate may be adapted to be conductive, so that the conductive front side polarization plate can function as a film for static protection.

Figure 10:
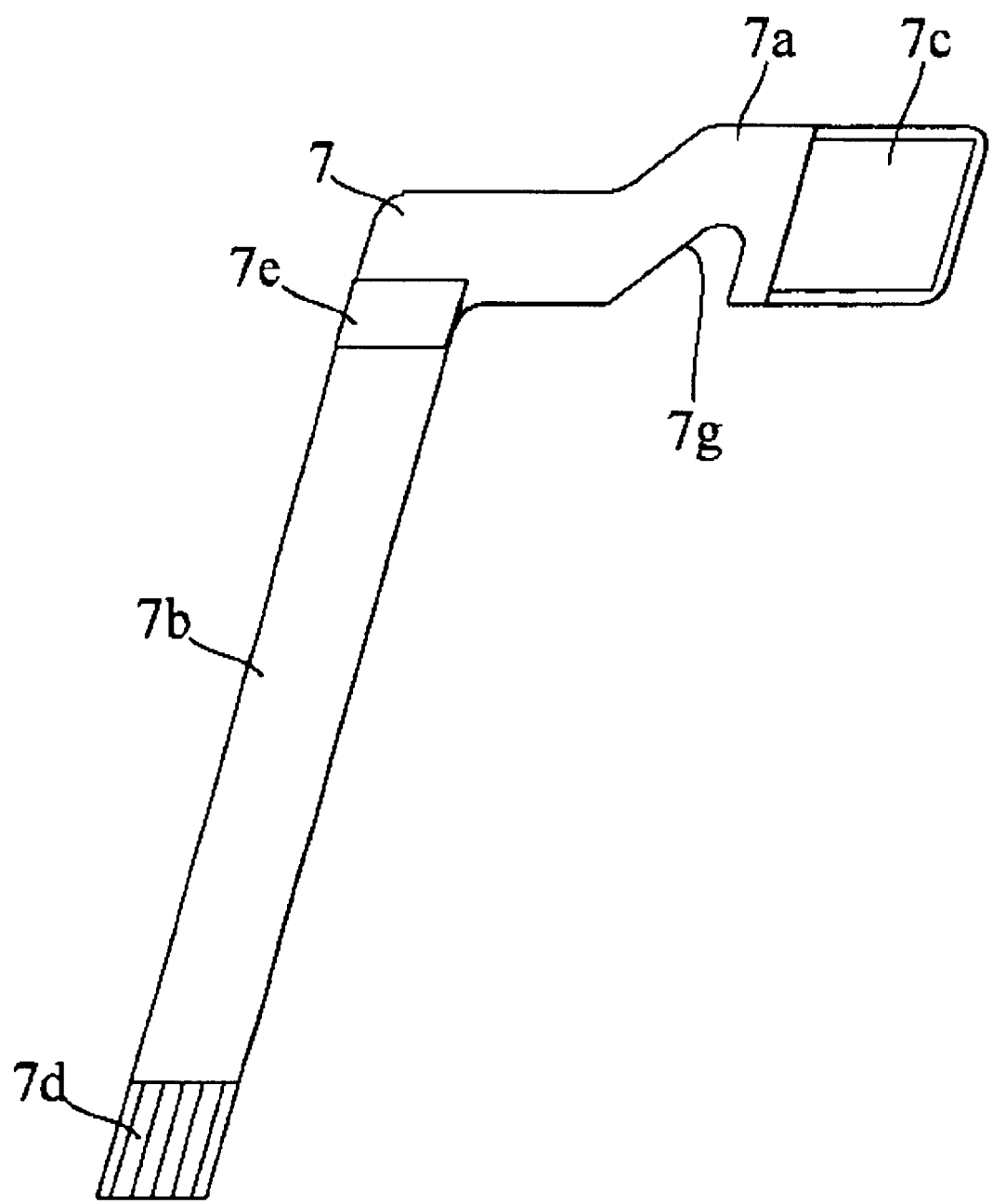
FIG. 10 is a perspective view of an example of a modification of the flexible printed circuit board for static protection used in the head-up display.

In the aforementioned embodiment of the invention, the engaging aperture 7f is formed by drilling a hole in the internal portion 7a of the static protection FPC 7, however the invention is not limited to the same embodiment. As shown in FIG. 10, a cut-out formed by cutting out a part of the internal portion 7a of the static protection FPC 7 may also be used as an engaging aperture 7g.

What is claimed is:

1. A display device comprising:
   a display panel including a surface on which a transparent conductive film is disposed;
   a first flexible printed circuit board including a ground line, the first flexible printed circuit board being provided to the display panel and coupled to an external device;
   a box-formed storing case constituted by a metal case for storing the display panel; and
   a second flexible printed circuit board electrically coupling the ground line of the first flexible printed circuit board to the metal case,
   wherein the metal case is electrically coupled to the transparent conductive film,
   wherein the second flexible printed circuit board has an internal portion disposed inside of the storing case, and the internal portion of the second flexible printed circuit board is provided with a terminal area on the side of the metal case, the terminal area being electrically coupled to the metal case,
   wherein the storing case further includes a resin case, the metal and resin cases are engaged with each other so as to be held in a box form, and the terminal area on the side of the metal case of the second flexible printed circuit board is sandwiched between the metal and resin cases with the storing case held in a box form, and
   wherein the internal portion of the second flexible printed circuit board is provided with an engaging aperture, one of the metal and resin cases is provided with a protrusion to be engaged with the engaging aperture of the second flexible printed circuit board, and the terminal area on the side of the metal case of the second flexible printed circuit board is sandwiched between the metal and resin cases with the engaging aperture of the second flexible printed circuit board engaged with the protrusion provided to one of the metal and resin cases.

2. The display device according to claim 1, wherein the protrusion to be engaged with the engaging aperture of the second flexible printed circuit board is provided to the resin case, and the metal case is provided with a hole into which the protrusion provided to the resin case is inserted with the engaging aperture of the second flexible printed circuit board engaged with the protrusion provided to the resin case.

* * * * *